United States Patent
Mohindra

Patent Number: 5,438,692
Date of Patent: Aug. 1, 1995

[54] DIRECT CONVERSION RECEIVER

[75] Inventor: Rishi Mohindra, Eindhoven, Netherlands

[73] Assignee: U.S. Philips Corporation, New York, N.Y.

[21] Appl. No.: 133,546

[22] Filed: Oct. 7, 1993

[30] Foreign Application Priority Data

Nov. 26, 1992 [EP] European Pat. Off. .......... 92203648

[51] Int. Cl.⁶ ................................................. H04B 1/26
[52] U.S. Cl. ................................. 455/324; 455/182.2; 455/192.2; 375/344
[58] Field of Search ............... 455/209, 324, 304, 306, 455/182.2, 192.2, 316, 164.1, 164.2; 375/97

[56] References Cited
FOREIGN PATENT DOCUMENTS 2180419  3/1987  United Kingdom .
WO9208294  5/1992  WIPO .

Primary Examiner—Reinhard J. Eisenzopf
Assistant Examiner—Mary M. Lin
Attorney, Agent, or Firm—Leroy Eason

[57] ABSTRACT

A direct conversion receiver, such as a paging receiver includes a local oscillator for mixing down to baseband a received radio frequency signal having a carrier frequency which is digitally modulated (FSK). To provide automatic frequency control, instead of using a control loop, the present invention includes means which at intervals evaluates the recovered digital signal to determine whether a predetermined quality thereof is within a selected D/A conversion range. A microcontroller including a D/A converter generates a control signal for the local oscillator to maintain the oscillator at a frequency such that the signal quality remains within the selected conversion range.

20 Claims, 3 Drawing Sheets

DIRECT CONVERSION RECEIVER

SUMMARY OF THE INVENTION

1. Field of the Invention

The present invention relates to a direct conversion receiver comprising a local frequency generating arrangement which is coupled to a pair of quadrature related mixers for mixing down a modulated rf input signal to obtain quadrature related signals, a demodulator for demodulating the quadrature related signals into demodulated dam, and a.f.c. means for providing a control signal for the local frequency generating arrangement, the a.f.c. means being coupled to quadrature paths. Such direct conversion receivers are usually digital paging receivers or transceivers using FSK (Frequency Shift Keying) modulation, but can also be transceivers for cordless telephony or the like.

2. Description of the Related Art

A direct conversion receiver of this kind is known from the British Patent Application GB 2 180 419. In such known direct conversion receiver, an a.f.c. (automatic frequency control) signal for a local oscillator with inherent correct polarity is derived from so-called I- and Q-channel receiver paths. For this purpose, a baseband I-channel signal is fed to a phase detector, together with a Q-channel signal, which is also fed to a frequency discriminator. Output signals of the phase detector and the frequency discriminator are fed to a multiplier, an output of which provides the control signal, which is fed to the local oscillator via a low pass filter as a loop filter. The a.f.c. means are complex, in that a closed loop is used comprising a loop filter. Other known direct conversion receivers, such as paging receivers with a crystal oscillator as the local oscillator, are subject to frequency drift problems due to crystal aging and temperature drift, which become more difficult to overcome the higher the data rate.

SUMMARY OF THE INVENTION

It is an object of the present invention to provide a direct conversion receiver not having the drawbacks of known receivers, and having reduced complexity.

To this end a direct conversion receiver according to the present invention is characterized in that the a.f.c. means comprise a digital-to-analog conversion arrangement for providing the frequency control signal, signal quality determining means for determining a valid data signal from the demodulated data, storage means for storing a valid data range during scanning intervals, and means for adjusting the output signal of the digital-to-analog conversion arrangement to an adjustment value within the valid data range. A very simple a.f.c. means is achieved, a loop falter being dispensed with. The a.f.c. essentially is based upon open loop control, the frequency control signal being updated from time to time, preferably on a regular basis. By looking at particular parts of the received signal or examining other received signal characteristics during the scanning intervals, while stepping through a range of output values of the digital-to-analog conversion arrangement, the valid data range is determined. The present invention is based upon the insight that such scanning need not be repeated very often, temperature drift or aging being slow processes.

It is known from international application WO 92/08294 to provide an a.f.c. for a superheterodyne receiver having a digital-to-analog converter for supplying a control signal to a local oscillator, but this a.f.c. essentially is a digital closed loop a.f.c., i.e. a closed loop error signal is computed on the basis of a measured offset frequency. Furthermore, a separate RSSI circuit (Received Signal Strength Indication) is necessary, the disclosed method only working for strong signals.

In an embodiment of the direct conversion receiver according to the present invention, the adjustment value is a value around a mid-range value within the valid data range. In this way a more reliable adjustment value is obtained than at the boundaries of the valid data range, where transition from valid to unvalid data occurs more readily due to oscillator drift.

In a further embodiment of the direct conversion receiver according to the present invention, in a first operating mode a first range is scanned, and in a second operating mode a second, limited, range is scanned around a previous adjustment value. This achieves that frequency scanning time is reduced once an operating point has been adjusted.

In a further embodiment of the direct conversion receiver according to the present invention, valid data scanning is halted during expected data frames. This achieves, when scanning overlaps expected data frames, that these data frames are not lost. In practice, for robust detection of valid data, such overlap will occur. Thus, the scanning can be done between data frames.

In an embodiment of the direct conversion receiver according to the present invention, the signal quality determining means comprise a frequency-to-voltage converter coupled to an analog-to-digital conversion arrangement or to a comparison arrangement, for determining the valid data signal. In this embodiment, the signal quality is determined on the basis of a threshold of operation with respect to BER (bit error rate). The signal frequency at the threshold of operation can be differentiated from the frequency of a noise signal alone, i.e. where no data are present.

In another embodiment of the direct conversion receiver according to the present invention, the signal quality determining means comprise a microcontroller coupled to a gated counter for determining the valid data signal. In this embodiment, the control signal value is preferably chosen such that a minimum counter value is achieved, corresponding to a mid-range value within the valid data range.

In another embodiment of a direct conversion receiver according to the present invention, the signal quality determining means determine the valid data signal on the basis of signal characteristics of the demodulated data, such as a valid CRC, a CRC with a unique error syndrome, a data frame preamble, a sync pattern, or a BER. The acronym CRC means Cyclic Redundancy Code, and the acronym BER means Bit Error Rate. In this embodiment preferably a microcontroller is to be used, evaluating the signal characteristics. Detection of the signal characteristics can be done according to relevant standards, e.g. the POGSAG paging standard.

In a further embodiment of a direct conversion receiver according to the present invention, the local frequency generating arrangement comprises a thermally insulated crystal. It is achieved that the period between consecutive scans is prolonged. Especially in a direct conversion communication device as a handheld device, usually being powered by means of batteries, this leads to battery saving.

A further embodiment of a direct conversion receiver according to the present invention is characterized in that the receiver comprises first a.f.c. means and also second a.f.c. means particularly suitable for relatively strong ff input signals, and RSSI-means for determining the signal strength of the input signal. The direct conversion receiver is arranged to switch over from the first to the second a.f.c. means when the determined signal strength exceeds a predetermined threshold value. An optimal a.f.c. means is thus achieved. The first a.f.c. means are optimised for relatively low rf input signal power, whereas the second a.f.c. means are optimised for relatively high rf input power, leading to an overall optimal a.f.c. performance.

BRIEF DESCRIPTION OF THE DRAWING

The present invention will now be described, by way of example, with reference to the accompanying drawings, wherein FIG. 1 schematically shows a direct conversion receiver according to the present invention.

DESCRIPTION OF THE PREFERRED EMBODIMENTS

Figure 1:
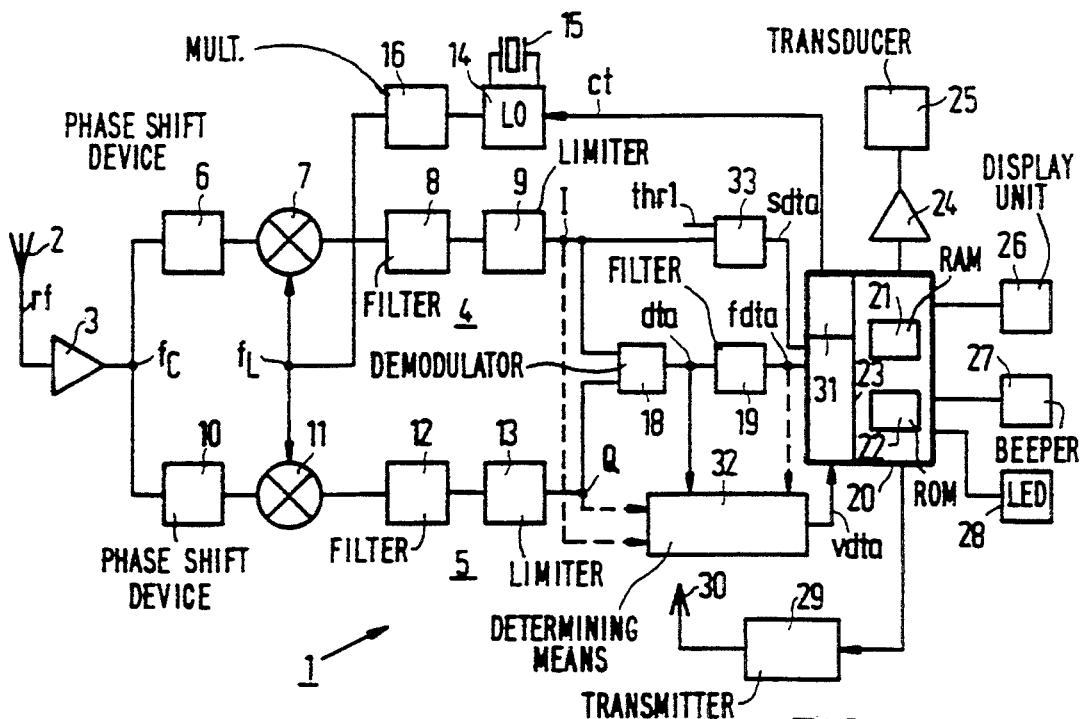

FIG. 1 schematically shows a direct conversion receiver 1 according to the present invention. The direct conversion receiver 1, which can be a paging transceiver, comprises an antenna 2 for receiving an rf (radio frequency) input signal rf, which can be an ff FSK (Frequency Shift Keying) signal carrying FSK modulated digital signals. The rf input signal rf is fed to a low noise rf amplifier 3, which is coupled to quadrature paths 4 and 5, so-called I- and Q-channels, for mixing down the ff input signal ff to quadrature related signals I and Q. The quadrature path 4 comprises a phase shifting device 6 causing a +45 degrees phase shift of the amplified rf signal. The phase shifting device 6 is coupled to a mixer 7 for mixing down the rf signal rf to the signal I, an output of the mixer 7 being filtered and limited by means of a respective filter 8 and a limiter 9. Similarly, the quadrature path 5 comprises a phase shifting device 10 causing a −45 degrees phase shift of the amplified rf signal, a mixer 11, a filter 12, and a limiter 13 for achieving the signal Q. The filters 8 and 12 are provided for limiting the noise bandwidth and for channel selectivity. By AC-coupling of the filters 8 and 12 to the mixers 7 and 11, DC-offset effects are avoided. The limiters 9 and 13 are provided for removing amplitude signal variations. The mixers 7 and 11 are further coupled to a local frequency generating arrangement 14, e.g. a crystal oscillator having a crystal 15 as a frequency determining element, via a frequency multiplication arrangement 16. The local frequency generating arrangement 14 can also be a more elaborate arrangement, e.g. a frequency sysnthesizer having a crystal oscillator for providing a reference frequency. Such frequency synthesizers can operate on the basis of a PLL (phase locked loop). In a direct conversion receiver the mixing frequency, i.e. an output frequency $f_L$ of the multiplication arrangement 16, further denoted as oscillator frequency, is chosen such that zero intermediate-frequency signals I and Q are obtained for a carrier frequency $f_c$. Instead of two phase shifting devices, with +45 degrees and −45 degrees phase shifting, respectively, a single 90 degrees phase shifting device can be used, for phase shifting the oscillator signal for one of the mixer signals. For example for FSK modulated rf signals with a frequency deviation of +4 kHz and −4 kHz around a 900 MHz carder frequency $f_c$, the carrier not physically being present in the received rf input signal rf, representing logical "0" and logical "1" transmitted signals, the signals I and Q are 4 kHz signals, though differing in relative phase, if $f_L = f_c$. In case of a frequency offset of the oscillator frequency $f_L$ with respect to the rf input signal rf, i.e. with respect to the cartier frequency $f_c$, the baseband signals I and Q will have equal frequencies but will have different logic values during data "1" and data "0". For obtaining the demodulated data, the direct conversion receiver 1 comprises a demodulator 18 to which the quadrature related signals I and Q are fed. The demodulator 18 can be a lead-lag phase detector for demodulating FSK data. The demodulator 18 is coupled via a data filter 19 to a microprocessor 20 with RAM and ROM memory 21 and 22 and an I/O-interface 23. Such microprocessors are well known in the art. The demodulator 18 provides demodulated data dta, and the data filter 19 provides filtered demodulated data fdta. For a paging transceiver, various output signals may be provided for such as a audio signal via an amplifier 24 and a speech transducer 25, an information message via a display unit 26, a audible tone signal via a beeper 27, and a visual alert signal via an LED 28. In the case of a paging transceiver, transmitter means 29 are provided for sending a return message, which means 29 are controlled by the microprocessor 20, the transmitting means being coupled to a transmitting aerial 30. According to the present invention, the direct conversion receiver 1 also comprises a.f.c. means having a digital-to-analog conversion arrangement 31 for providing a control signal ct for the local oscillator 14, and signal quality determining means 32 for determining a valid data signal vdta from the demodulated data dta, from the filtered demodulated data fdta, from one of the signals I and Q, i.e. from an output signal of the limiter 9 or 13, or from a product of the signals I and Q. Storage means 21 stores a valid data range during scanning intervals, the storage means being, for example, RAM memory. The microprocessor 20 adjusts the output signal ct of the digital-to-analog conversion arrangement 31 to an adjustment value which is within the valid data range. The operation of the various embodiments will be described together with the description of the embodiments.

In more general terms, on the basis of a particular quality criterion, the signal quality determining means 32 determine the quality of the received signal rf over a stepping range of the digital-to-analog conversion means 31, the stepping being controlled by the microprocessor 20, during scanning intervals. The microprocessor 20 determines a valid data range and adjusts the control signal ct to an adjustment value within the valid data range, preferably a mid-range value. The scanning preferably is at regular intervals, e.g. every 5 or 10 minutes. The scanning can be interrupted in case of overlap with expected data frames, an old adjustement value still being used as the control signal ct. In a first mode a whole output range of the digital-to-analog conversion can be stepped, whereas in a second mode, after an initial first scanning, only a limited stepping can be done around an operating point of the control signal ct, being the last adjustment value obtained during a previous scanning. In case of a no signal or weak signal condition during normal data reception intervals, there is no need to start the scanning procedure immediately, since such condition could be due to signal fading, or even due to an interruption of signal transmission. If during regular scanning no valid data is detected, the scanning could be repeated more often. In between scanning intervals, normal reception could be tried using the last adjustment value of the control signal ct. The present invention allows for quite higher data rates as with known paging receivers, since the offset frequency is made very small by the a.f.c. means. The signal quality determining means 32 can be implemented in hardware or software, in the latter case stored in the ROM memory 22. The digital-to-analog conversion arrangement 31 can be built into the microprocessor 20, as shown, but can also be a separate device. Also, the a.f.c. means can be implemented as a separate IC (Integrated Circuit). As to the advantage of having a simple a.f.c. means, furthermore, as compared with known receivers using crystal oscillators without applying an a.f.c. control signal thereto, no complicated temperature drift or aging drift compensation schemes are necessary. For example, a less than 2.8 ppm temperature drift or aging drift compensation in such known receivers in the 900 MHz band would be expensive or even impractical in paging receivers. The present invention allows for using crystals without temperature compensation. For prolonging periods between scanning, the crystal 15 is thermally insulated. Such insulation as such is well known in the art. A lot of heat transfer from the crystal to the environment thereof occurs via electrical connection leads of the crystal. By applying long connection leads which are helically wounded while at the same time insulated, a good heat insulation is obtained.

Figure 2:
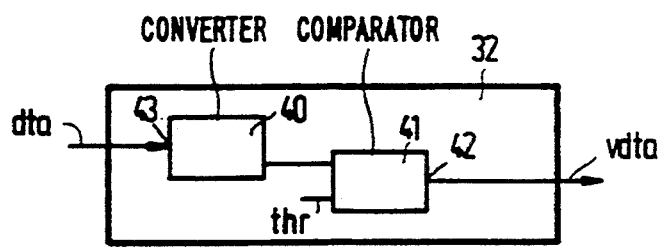
FIG. 2 shows an embodiment of signal quality determining means according to the present invention.

FIG. 2 shows an embodiment of the signal quality determining means 32 according to the present invention, the same reference numerals having been used for corresponding features. The signal quality determining means 32 comprise a frequency-to-voltage converter 40 coupled to a comparator 41 having an output 42 which provides the valid data signal vdta, e.g. a logic "0" signal representing valid data, and a logic "1" signal representing invalid dam. The input signal to input 43 of the frequency-to-voltage converter 40 can be, the demodulated data dta, as shown, or the filtered demodulated data fdta, or one of the quadrature related signals I or Q produced of the outputs of limiters 9 and 13, or the product of the signals I and Q.

Figure 3:
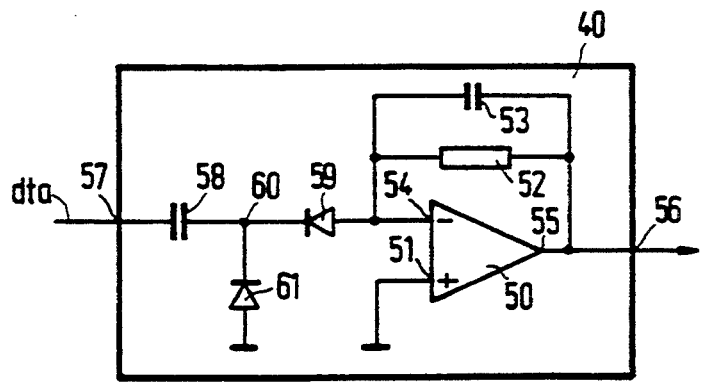
FIG. 3 shows a frequency-to-voltage converter in signal quality determining means according to the present invention.

FIG. 3 shows an embodiment of the frequency-to-voltage converter 40 in signal quality determining means 32 according to the present invention. The frequency-to-voltage converter 40 comprises an opamp 50 with a plus input 51 coupled to ground, and with a parallel arrangement of a resistor 52 and a capacitor 53 coupled between a minus input 54 and an output 55 of the opamp 50, the output 55 being an output 56 of the frequency-to-voltage converter 40. Coupled between an input 57 of the frequency-to-voltage converter 40 and the input 54 is a series arrangement of a capacitor 58 and a diode 59, and between a connection point 60 of the capacitor 58 and the diode 59 a diode 61 connected to ground. The converter 40 operates as a diode-pump frequency indicator on digital input data. The determination of a valid data signal is based upon the idea that the presence of a signal can be distinguished from noise alone or a too bad signal from BER (Bit Error Rate) point of view. When a valid data signal is present, the measured frequency of the signal I and Q would be around a modualtion deviation frequency $\Delta f$, e.g. $\Delta f = 4$ kHz, whereas for no data or bad data the frequency will be substantially higher due to presence of mainly noise and higher baseband frequencies due to the frequency offset. Distinction between valid or invalid data is made by comparing an output of the frequency-m-voltage converter 40 with a threshold value thr, if the comparator 41 is used. Instead of the comparator 41 an analog-to-digital converter can be used, which then provides digital values to the microcontroller 20. In the latter case, the microcontroller 20 determines the valid data signal vdta.

Figure 4:
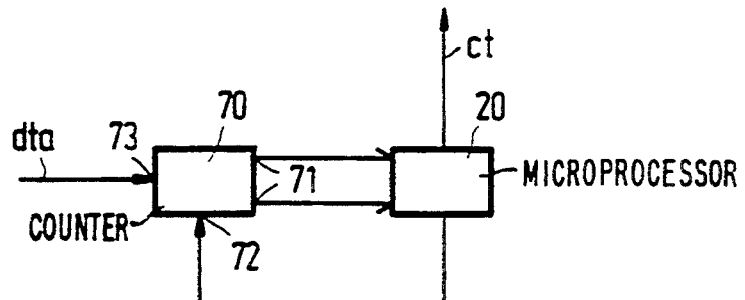
FIG. 4 shows another embodiment of signal quality determining means according to the present invention.

FIG. 4 shows another embodiment of the signal quality determining means 32 according to the present invention, comprising a gated counter 70 coupled with a counter output 71, and with a gate input 72 to the microcontroller 20, which provides the control signal ct. The demodulated data dta, as shown, or the filtered demodulated data fdta, or one of the signals I or Q, or the product of the signals I and Q, is fed to a counter input 73. For valid data, the counter exhibits a range of output values around a minimum counter value, whereas higher counter values correspond to invalid data. It has been shown that use of limiter output data gives a more reliable valid data determination, use of demodulated data possibly giving rise to local minima at which an incorrect decision can be made.

Figure 5:
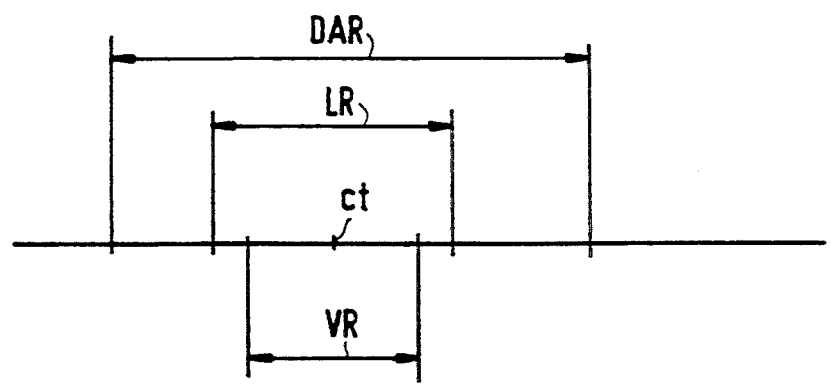
FIG. 5 shows ranges according to the present invention.

FIG. 5 shows ranges of an output of the digital-to-analog converter 31 according to the present invention. Shown are a full output voltage range DAR of the digital-to-analog conversion arrangement 31, scanned during the first operating mode, a valid data range VR during a scanning interval, and a limited range LR, scanned during the second operating mode. Preferably, an adjustment value for the control signal ct is chosen as a mid-range value or in the vicinity thereof, as it should be realized that there is no sharp transition between valid and invalid data at edges of the valid data range VR. In the second operating mode, the limited range LR is preferably centered around the adjustment value set during the first operating mode.

Figure 6:
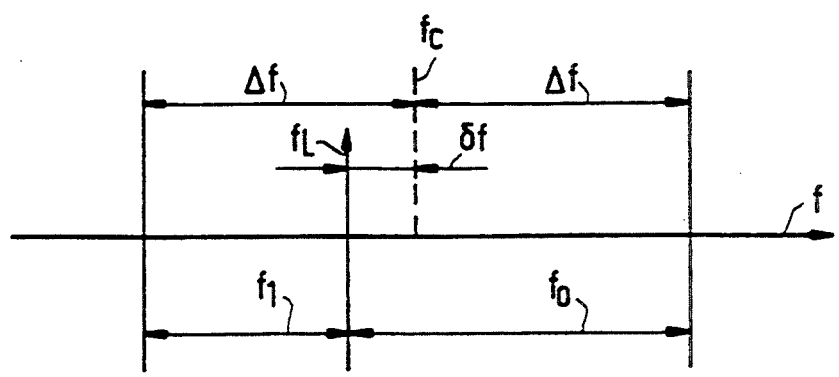
FIG. 6 shows frequencies of signals according to the present invention.

FIG. 6 shows frequencies of signals according to the present invention. Shown are the (fictitious) carrier frequency $f_c$, the oscillator frequency $f_L$, a frequency deviation $\Delta f$ of data "0" and data "1" FSK modulated signals with respect to the fictitious carder frequency $f_c$, a frequency offset $\delta f$ of the oscillator frequency $f_L$ with respect to the carrier frequency $f_c$, and $f_0$ and $f_1$ signals, representing demodulated signals for data "0" and data "1", respectively.

Figure 7:
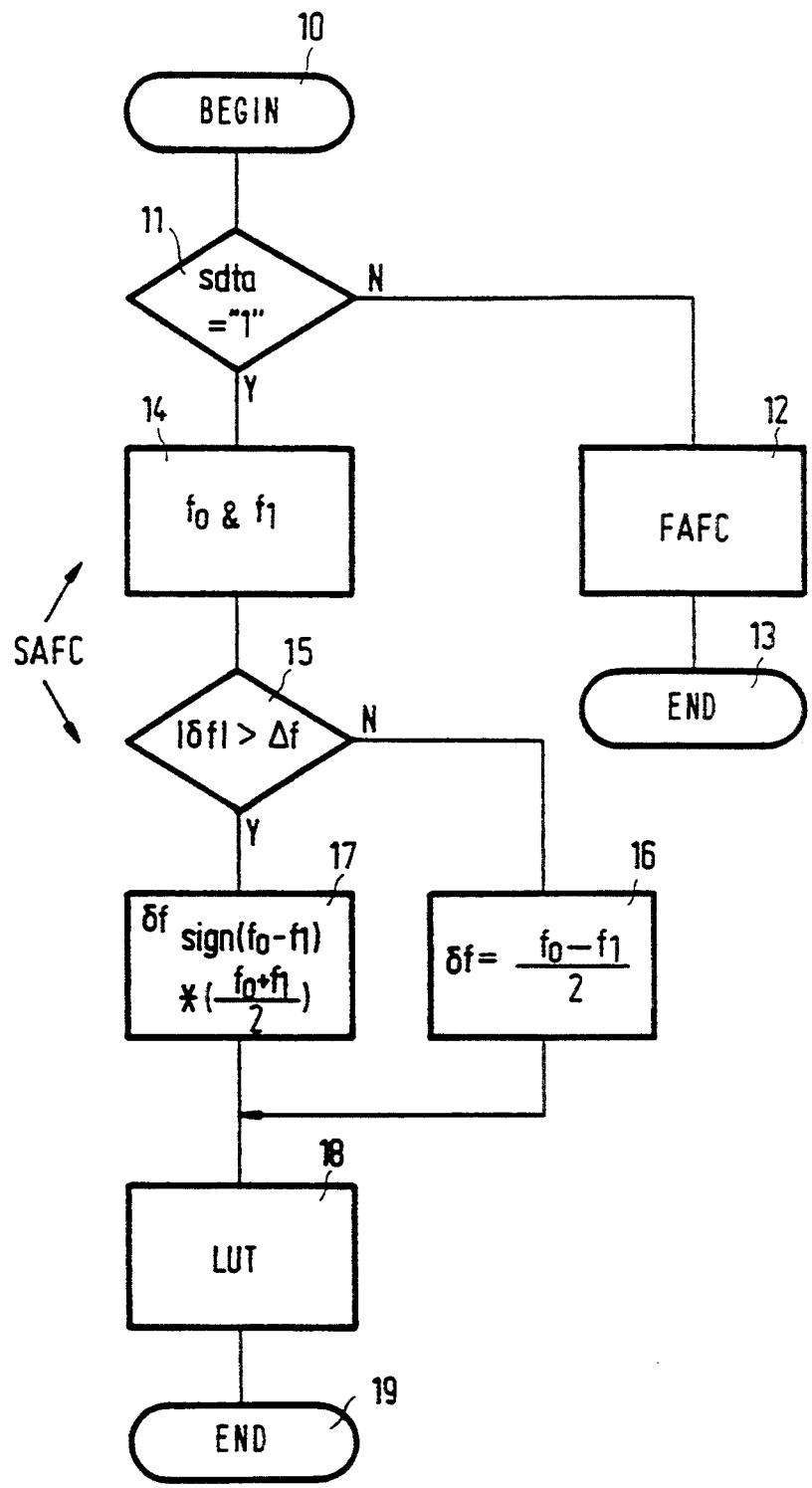
FIG. 7 shows a flow chart for second a.f.c. means in a direct conversion receiver according to the present invention.

FIG. 7 shows a flow chart for second a.f.c. means in a direct conversion communication device according to the present invention, which are embodied by means of a stored program in the ROM 22 of the microcontroller 20. The described a.f.c. means according to the present invention form first a.f.c. means. A further embodiment of a direct conversion communication device 1 according to the present invention is arranged for switching over from the first a.f.c. means to the second a.f.c. means and vice versa on the basis of the signal strength of the input signal rf. For determining the signal strength of the input signal rf, the direct conversion receiver is provided with RSSI-means (Received Signal Strength Indication), which can be conventional RSSI-means (not shown), or a gated counter such as described in relation to FIG. 4. In the latter case the signal strength is determined on the basis of the frequency of a counter input signal, being the signal I or Q, or the product of the signals I and Q. A conventional analog RSSI-signal can be obtained from one of the limiters 9 and 13, which analog RSSI-signal can then be compared with a predetermined threshold value thrl by means of a comparator 33. An output signal sdta of the comparator 33, indicating that the limiter signal is above the threshold value thrl, ie. a relatively strong signal, is fed to the microcontroller 20, implementing the second a.f.c. means. The microcontroller switches over from the first to the second a.f.c. means on the basis of the signal sdta. The second a.f.c. means are now described with the help of the flow chart of FIG. 7. Shown is a program begin block 10. In a test block 11, the stored program in the ROM 22 tests the signal sdta. If the signal sdta has got a logical value "1", corresponding to a relatively strong rf input signal, the microcontroller 20 switches over to the second a.f.c. means, which is particularly optimized for strong input sigals rf. Otherwise the microcontroller 20 controls the first a.f.c. means, as described, indicated with an acronym FAFC, meaning First A.F.C. means, i.e. the valid data scanning according to the present invention, in block 12. The program routine then ends with an end block 13. The second a.f.c. means, indicated with an acronym SAFC, meaning Second A.F.C. means, first comprise measuring of the $f_0$ and $f_1$ signals in block 14, e.g. with counter means as described, i.e. if the demodulated data is "0", $f_0$ is measured, whereas $f_1$ is measured if the demodulated data is "1". In a test block 15 it is tested if $f_1 > 2\Delta f'$ or $f_0 > 2\Delta f'$, i.e. whether $|\delta f| > \Delta f$. It is to be noticed that $\Delta f' \approx \Delta f$, whereby the exact value of $\Delta f'$ depends on an applied pre-modulation de-emphasis. If the condition in block 15 is not true, i.e. an in-range situation applies, $\delta f$ is calculated in block 16, according to $\delta f = (f_0 - f_1)/2$. If the condition in block 15 is true, i.e. an out-of-range situation applies, $\delta f$ is calculated in block 17, according to $[\text{sign}(f_0 - f_1)]*[(f_0 + f_1)2]$, sign being the well known mathematical sign function. In block 18, the microcontroller determines an input value for the digital-to-analog conversion arrangement 31, providing the control signal ct, the input value e.g. being determined by applying the calculated frequency offset value $\delta f$ as an address value for a lookup table LUT in the ROM 22, the lookup table LUT comprising digital representations of control values ct. The lookup-table can be filled with data reflecting a known or measured a.f.c. behaviour of the direct conversion device 1. At last an end block 19 is shown. The first and second a.f.c. means can be optimised such that an overall a.f.c. performance is approximately linear with the signal power of the input signal rf.

I claim:

1. A direct conversion receiver comprising a local frequency generating arrangement which is coupled to a pair of quadrature related mixers for mixing down a radio frequency input signal (rf) to derive quadrature related signals (I, Q), a demodulator for demodulating the quadrature related signals into demodulated data (dta), and automatic frequency control (a.f.c.) means for providing a control signal (ct) for the local frequency generating arrangement, the a.f.c. means being coupled to quadrature paths; characterized in that the a.f.c. means comprise a digital-to-analog conversion arrangement for providing the control signal (ct), signal quality determining means for determining a valid data signal (vdta) from the demodulated data (dta), storage means for storing a valid data range (VR) during data scanning intervals, and means for adjusting an output signal of the digital-to-analog conversion arrangement to an adjustment value within the valid data range (VR).

2. A direct conversion receiver as claimed in claim 1, wherein the adjustment value is approximately at the middle of the valid data range (VR).

3. A direct conversion receiver as claimed in claim 1, wherein in a first operating mode a first data range (DAR) is scanned and in a second operating mode a second more limited data range (LR) is scanned around an adjustment value (ct) of the first range.

4. A direct conversion receiver (1) as claimed in claim 1, wherein valid data scanning is halted during expected data frames of the rf input signal.

5. A direct conversion receiver (1) as claimed in claim 1, wherein the scanning is repeated on a regular basis.

6. A direct conversion receiver (1) as claimed in claim 1, wherein the signal quality determining means comprise a frequency-to-voltage converter coupled to a comparator for determining the valid data signal (vdta).

7. A direct conversion receiver (1) as claimed in claim 1, wherein the signal quality determining means comprise a microprocessor coupled to a gated counter for determining the valid data signal (vdta).

8. A direct conversion receiver as claimed in claim 1, wherein the signal quality determining means determine the valid data signal (vdta) on the basis of signal characteristics of the demodulated data (dta), such as a valid cyclic redundancy code (CRC), a CRC with a unique error syndrome, a data frame preamble, a sync pattern, or a bit error rate (BER).

9. A direct conversion receiver as claimed in claim 1, wherein filtered demodulated data (fdta) are used for determining the valid data signal (vdta) instead of the demodulated data (dta).

10. A direct conversion receiver as claimed in claim 1, comprising limiters in the quadrature paths and wherein an output signal of one of the limiters or a product of the output signals of both limiters is used for determining the valid data signal (vdta) instead of the demodulated data (dta).

11. A direct conversion receiver as claimed in claim 1, wherein the local frequency generating arrangement comprises a thermally insulated crystal.

12. A direct conversion receiver as claimed in claim 1, further comprising second a.f.c. means particularly suitable for relatively strong rf input signals, and received signal strength indicator (RSSI)-means for determining a signal strength of the rf input signal (rf), the direct conversion receiver being arranged for switching over from the first-named a.f.c. means to the second a.f.c. means if the determined signal strength exceeds a predetermined threshold value (thrl).

13. A direct conversion receiver as claimed in claim 12, wherein the second a.f.c. means comprise means for determining a frequency offset ($\delta f$) of the local frequency generating arrangement on the basis of measured frequencies ($f_0$, $f_1$) of the demodulated data (dta), for an in-range and an out-of-range situation, respectively, and look-up table means (LUT) for determining the control signal (ct) on the basis of the determined frequency offset.

14. A direct conversion receiver as claimed in claim 13, wherein the lookup-table (LUT) comprises predetermined control signal values, the determined frequency offset ($\delta f$) being an address value for addressing the lookup-table.

15. A direct conversion receiver as claimed in claim 2, wherein in a first operating mode a first data range (DAR) is scanned and in a second operating mode a second more limited data range (LR) is scanned around an adjustment value (ct) of the first range.

16. A direct conversion receiver (1) as claimed in claim 2, wherein valid data scanning is halted during expected data frames of the rf input signal.

17. A direct conversion receiver (1) as claimed in claim 2, wherein the scanning is repeated on a regular basis.

18. A direct conversion receiver (1) as claimed in claim 2, wherein the signal quality determining means comprise a frequency-to-voltage converter (40) coupled to a comparator, for determining the valid data signal (vdta).

19. A direct conversion receiver (1) as claimed in claim 2, wherein the signal quality determining means comprise a microprocessor coupled to a gated counter (70) for determining the valid data signal (vdta).

20. A direct conversion receiver (1) as claimed in claim 2, wherein the signal quality determining means determine the valid data signal (vdta) on the basis of signal characteristics of the demodulated data (dta), such as a valid cyclic redundancy code (CRC), a CRC with a unique error syndrome, a data frame preamble, a sync pattern, or a bit error rate (BER).

* * * * *